United States Patent
Puchner

(10) Patent No.: US 6,358,806 B1
(45) Date of Patent: Mar. 19, 2002

(54) SILICON CARBIDE CMOS CHANNEL

(75) Inventor: Helmut Puchner, Santa Clara, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/896,958

(22) Filed: Jun. 29, 2001

(51) Int. Cl.$^7$ .............................................. H01L 21/336
(52) U.S. Cl. ...................................... 438/308; 438/931
(58) Field of Search ................................. 438/166, 308, 438/795, 931

(56) References Cited

U.S. PATENT DOCUMENTS

| | | | |
|---|---|---|---|
| 5,510,630 A | * 4/1996 | Agarwal et al. | 257/77 |
| 5,641,695 A | * 6/1997 | Moore et al. | 438/186 |
| 6,271,066 B1 | * 8/2001 | Yamazaki et al. | 438/166 |

* cited by examiner

Primary Examiner—David Nelms
Assistant Examiner—David Nhu
(74) Attorney, Agent, or Firm—Luedeka, Neely & Graham, P.C.

(57) ABSTRACT

A method for fabricating a semiconducting device on a substrate, where the improvement includes forming a strained silicon carbide channel layer on the substrate. A silicon layer is formed on top of the strained silicon carbide channel layer. A gate insulation layer is formed on top of the silicon layer and strained silicon carbide channel layer, at a temperature that does not exceed about eight hundred centigrade. A gate electrode is formed on top of the gate insulation layer, and the gate electrode is patterned. A low dose drain dopant is impregnated into the substrate, and activated with a first laser anneal. A source drain dopant is impregnated into the substrate, and activated with a second laser anneal. After the step of activating the low dose drain dopant with the first laser anneal, an insulating layer is formed around the gate electrode, at a temperature that does not exceed about eight hundred centigrade, and a spacer is formed around the gate electrode. The spacer is formed of a material that is reflective to the second laser anneal. Thus, standard materials for the spacer, such as silicon oxide or silicon nitride are not preferred for this application, because they tend to be transparent to the laser beam emissions.

20 Claims, 1 Drawing Sheet

SILICON CARBIDE CMOS CHANNEL

FIELD

This invention relates to the field of integrated circuit processing. More particularly the invention relates to a method for forming a silicon carbide channel in a complimentary metal oxide integrated circuit.

BACKGROUND

As integrated circuits become more complex, there is incentive to reduce the surface area required on the substrate for the integrated circuit. Reducing the size of the integrated circuit tends to hold the die size to a reasonable level, and the device also tends to be operable at a higher speed. Unfortunately, as the size of integrated circuits is reduced, limits and constraints in regard to the proper operation of various device structures are encountered.

For example, one of the fundamental challenges for developing integrated circuits is optimizing the speed at which the integrated circuit operates. Because the mobility of holes tends to be lower than the mobility of electrons in many semiconducting materials, the drive current of PMOS transistors tends to be commensurately lower than the drive current of a similarly sized NMOS device, when each is driven at equal supply voltage potentials. Thus, the low drive current of the PMOS device tends to be one speed limiting parameter in certain integrated circuits, such as a logic inverter.

One method of compensating for this situation is to form larger PMOS devices, relative to the size of the NMOS devices. Thus, the larger PMOS structure has an ability to carry a commensurately larger drive current at the same supply voltage potential, because of the increased numbers of carriers. Unfortunately, addressing the problem by increasing the size of the PMOS structures is in direct opposition to the design goal of creating ever smaller integrated circuits.

Another method of compensating for the speed difference is to increase the drive current of the PMOS device by increasing the potential of the supply voltage at which it is driven, relative to that of the NMOS device. Unfortunately, it is often desirable to drive both the PMOS devices and the NMOS devices at the same potential. Thus, compensating for the difference in drive currents between the two structures in this manner is somewhat unsatisfactory. Further, if the higher drive potential is available on the die, then there is a desire to use it to drive the NMOS device at an even greater drive current. Therefore, providing different supply voltages to the different devices to balance the drive currents of the devices tends to be somewhat of an inelegant solution. Additionally, increasing the supply voltages may jeopardize the reliability of the devices due to hot carrier injection into the gate dielectric.

What is needed, therefore, is a structure and a method for its formation that can be used in PMOS and NMOS devices to achieve high drive currents and keep leakage currents low.

SUMMARY

The above and other needs are met by a method for fabricating a semiconducting device on a substrate, where the improvement includes forming a strained silicon carbide channel layer and a silicon capping layer on the substrate. A gate insulation layer is formed on top of the silicon capping layer, the gate insulation layer preferably formed at a temperature that does not exceed about eight hundred centigrade. A gate electrode is formed on top of the gate insulation layer, and the gate electrode is patterned. The substrate is amorphized using a species such as silicon, germanium, or argon. A low dose drain dopant is impregnated into the substrate, and activated with a first laser anneal. A source drain dopant is impregnated into the substrate, and activated with a second laser anneal.

Thus, by use of the strained silicon carbide channel layer the mobility of electrons and holes is increased by up to about seventy-five percent when applied to a one hundred nanometer technology. However, the use of strained silicon carbide imposes some limitations in the applied thermal budget once the strained silicon carbide layer is formed. If the strained silicon carbide layer is annealed at a temperature higher than about eight hundred and fifty centigrade, then the layer tends to relax and loose it favorable conduction properties. Therefore, the subsequent layers are formed at temperatures that are preferably below about eight hundred centigrade. Further, laser annealing is s preferably used for locally activating both the low dose drain dopant and the source drain dopant. Because the strained silicon carbide layer tends to have a lower thermal conductivity than that of the substrate, the heat generated by the laser pulses tends to not anneal the strained silicon carbide channel layer during the laser annealing. Annealing by other more traditional methods, such as rapid thermal annealing or furnace annealing to activate the implanted dopants, would tend to exceed the thermal budget of the strained silicon carbide channel layer.

In various preferred embodiments the strained silicon carbide channel layer is formed such as by deposition with a chemical vapor deposition process or growth with a surface reaction epitaxy process. The strained silicon carbide channel layer further is formed to a thickness of preferably about three hundred angstroms, and exhibits a tensile strain. The strained silicon carbide channel preferably has a composition $Si_{(1-y)}C_y$ where y is as high as about two tenths. Further, the strained silicon carbide channel layer for an NMOS device is preferably formed with an in situ boron dopant at a concentration of about $10^{17}$ atoms per cubic centimeter. Still further, an additional dopant may be implanted into the strained silicon carbide channel layer after it is formed. PMOS device s are preferably formed with dopants compatible with PMOS designs, and with concentrations commensurate with such designs.

In a most preferred embodiment, after the step of activating the low dose drain extension dopant with the first laser anneal, an insulating layer is formed around the gate electrode at a temperature that does not exceed about eight hundred centigrade, and a spacer is formed around the gate electrode. The spacer is formed of a material that is reflective to the second laser anneal. Thus, standard materials for the spacer, such as silicon oxide or silicon nitride are not preferred for this application, because they tend to be transparent to the laser beam emissions.

Most preferably the insulating layer around the gate electrode is formed of silicon oxide and the spacer material is formed of polysilicon. In other preferred embodiments, the substrate is silicon, the gate insulation layer is silicon oxide, and the gate electrode is polysilicon.

According to another aspect of the invention, a integrated circuit device is described, the improvement being a strained silicon carbide channel layer and a spacer around the gate electrode formed of a material that is reflective to the laser anneal.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
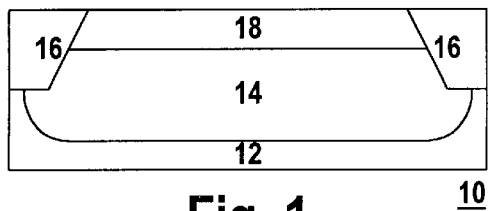
FIG. 1 is a cross sectional view of an integrated circuit substrate.

Turning now to the drawings, there is depicted in FIG. 1 a cross sectional view of a substrate 12 for an integrated circuit 10. The substrate 12 is preferably a silicon substrate. However, in alternate embodiments, substrates of other materials are also acceptable, with commensurate modification of the materials and dopants selected for the various other structures to be formed on the substrate 12, as described below.

The substrate 12 is depicted in FIG. 1 at a point in the processing where several structures have already been formed. For example, isolation structures 16 have been formed in the substrate 12. If the substrate 12 is formed of silicon, the isolation structures 16 are preferably silicon oxide, but may also be formed of silicon nitride or a combination of the two materials, or one or more of a number of different, substantially nonconductive materials. Further, differing types of isolation structures 16 may be so employed, such as plug isolation or, more preferably, shallow trench isolation.

A well 14 has also been formed in the substrate 12 by impregnating a dopant into the substrate 12. The dopant may be impregnated either during a diffusion process or more preferably by ion implantation. The specific dopant selected is dependant upon the type of device that is to be formed, whether PMOS or NMOS. In the example presented below, the specific example of an NMOS device is given. However, it is appreciated that the invention is equally applicable to PMOS devices. For the NMOS device depicted in FIG. 1, a dopant such as boron or indium is preferably used.

It is preferred to form an anti-punchthrough layer 18 by impregnating a dopant into the well 14. The dopant for the anti-punchthrough layer 18 may be introduced to the substrate 12 by diffusion, or more preferably by ion implantation.

Figure 2:
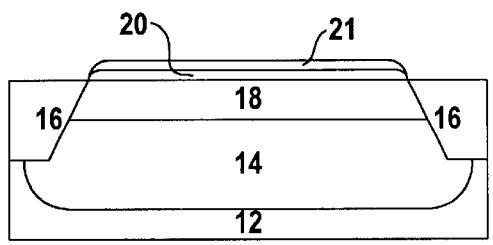
FIG. 2 is a cross sectional view of the integrated circuit substrate with a strained silicon carbide channel layer and a silicon capping layer.

As shown in FIG. 2, a strained silicon carbide channel layer 20 overlies the anti-punchthrough layer 18. The strained silicon carbide channel layer 20 preferably includes varying amounts of silicon and carbon, and can be generally represented by the formula $Si_{(1-y)}C_y$. Most preferably, y has a value as great as about two tenths. The strained silicon carbide channel layer 20 can be formed according to one or more of a variety of methods. For example, the strained silicon carbide channel layer 20 can be deposited by a chemical vapor deposition process, and then patterned and etched to form the structure as depicted over the anti-punchthrough layer 18 in FIG. 2. However, most preferably the strained silicon carbide channel layer 20 is grown from the silicon of the substrate 12 using a surface reaction epitaxy process.

To achieve high drive currents in the integrated circuit 10, and to keep leakage currents low, a super steep retrograde channel profile is desirable for the channel region of the integrated circuit 10, as described below. The strained silicon carbide channel layer 20 is preferably formed to a thickness of about three hundred angstroms, depending on the carbon concentration.

After growing the strained silicon carbide channel layer 20, it is also preferred to grow a capping layer 21 of in situ doped silicon, as shown in FIG. 2. According to one aspect of the invention, the strain buildup at the interface of the silicon carbide channel layer 20 and the in situ doped silicon capping layer 21 characterizes a region of enhanced carrier mobility. The strain-induced conduction band offset at the heterointerface between the silicon carbide layer 20 and the silicon capping layer 21 leads to the formation of a two-dimensional electron gas in the strained silicon carbide channel layer 20, and a substantial enhancement of the electron or hole mobility over the bulk mobility is observed.

The strain buildup at the interface of the silicon carbide channel layer 20 and the in situ doped silicon capping layer 21 is preferably a tensile stress resulting from the difference in the lattice constant when the silicon carbide layer 20 is capped with the silicon layer 21. The strain buildup at the interface of the silicon carbide channel layer 20 and the in situ doped silicon capping layer 21 tends to substantially enhance electron or hole mobility throughout the interface. Accordingly, a substantial increase in the electron or hole mobility is exhibited by the integrated circuit 10 due to the combination of the strain buildup throughout the interface of the silicon carbide channel layer 20 and the in situ doped silicon capping layer 21 and the properties of the strained silicon carbide channel layer 20.

The strained silicon carbide channel layer 20 is preferably formed with an in situ dopant, which for the specific example of the NMOS structure is most preferably boron, but may also be a material such as indium. The dopant is preferably found in the strained silicon carbide channel layer 20 at a concentration of between about $10^{16}$ atoms per cubic centimeter and about $10^{19}$ atoms per cubic centimeter, and most preferably about $10^{17}$ atoms per cubic centimeter. In alternate embodiments, an additional amount of the dopant can be introduced to the strained silicon carbide channel layer 20 after it is formed, either by diffusion or more preferably by ion implantation. Both the in situ doping of the strained silicon carbide channel layer 20 and the optional additional implantation are used to adjust the threshold voltage of the device 10.

Figure 3:
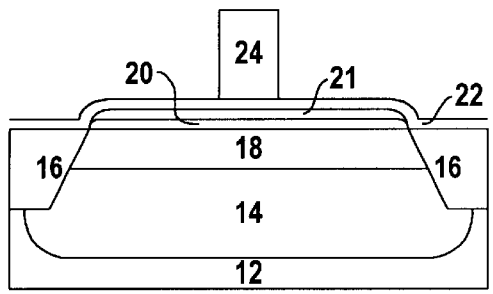
FIG. 3 is a cross sectional view of a strained silicon carbide channel layer, silicon capping layer, an overlying insulating layer, and a patterned gate electrode.

Referring now to FIG. 3, an insulation layer 22 overlies the strained silicon carbide channel layer 20 and the silicon capping layer 21. To continue the example of a silicon based integrated circuit 10, the insulation layer 22 is preferably formed of silicon oxide, which is either deposited or grown. However, other materials that are compatible with both the functions of the insulation layer 22 and the other materials as described herein may also be selected. Further, other processes, also compatible with the constraints as imposed by the other structures as described herein, may also be used to form the insulation layer 22. Additionally, other layers may preferably be deposited to buffer the silicon carbide layer 20 before the insulation layer 22 is formed, in order to enhance the quality of the insulation layer 22.

Regardless of the method employed to form the insulation layer 22, it is preferably formed at temperatures that do not exceed about eight hundred centigrade. The purpose of limiting the temperature of this and subsequent processing to about this temperature is to preserve and retain the desirable properties of the strained silicon carbide channel layer 20. As described above, one of the benefits of the strained silicon carbide channel layer 20 is an exhibition of an increased mobility for both electrons and holes, and thus an increased drive current at a given potential.

One reason for this increased carrier mobility is the strain induced conduction band offset that is present within the strained silicon carbide channel layer 20. Additionally, carrier mobility is increased due to the strain buildup present at the interface of the strained silicon carbide channel layer 20 and the silicon capping layer 21. As processing temperatures approach and exceed about eight hundred and fifty centigrade, the strained silicon carbide channel layer 20 is annealed and relaxes, and the stress within the strained silicon carbide channel layer 20 is dissipated. This tends to reduce in large measure the enhanced carrier mobility properties of the strained silicon carbide channel layer 20. Thus, care is preferably exercised to ensure that subsequent processing temperatures do not exceed about eight hundred and fifty centigrade, and most preferably do not exceed about eight hundred centigrade for any appreciable length of time.

Also depicted in FIG. 3 is a patterned gate electrode 24 residing atop the gate insulation layer 22. In the specific example as described herein, the gate electrode 24 is preferably formed of a conductive material, such as a heavily doped polysilicon.

Figure 4:
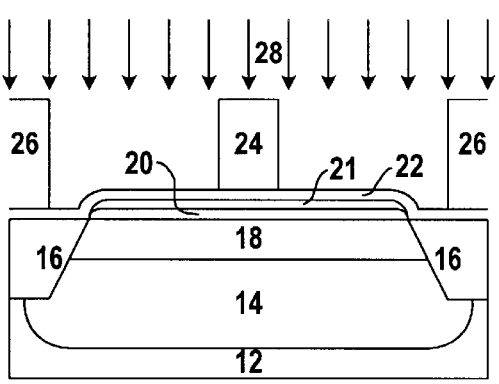
FIG. 4 is a cross sectional view of the structure of FIG. 3, with the structure masked for low dose dopant impregnation.

Low dose drain dopants 28 are preferably impregnated into the substrate 12 as depicted in FIG. 4. For the example of a silicon substrate 12 and an NMOS integrated circuit 10 as previously described herein, the low dose drain dopant 28 is preferably a species such as arsenic or antimony. The low dose drain dopants 28 are impregnated into the substrate 12 by one or more of a number of different processes such as diffusion and most preferably ion implantation. Prior to impregnation of the low dose drain dopants 28, the substrate 12 is most preferably amorphized with a species such as silicon, germanium, or argon. The amorphization tends to lower the thermal budget necessary to melt the crystal, thereby allowing the use of a lower laser fluence, as described further below.

Figure 5:
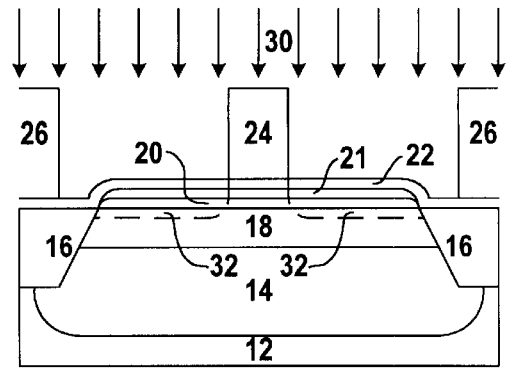
FIG. 5 is a cross sectional view of the structure of FIG. 4, depicting the first laser anneal.

The low dose drain dopants 28 form doped regions 32, as depicted in FIG. 5. The low dose drain dopants 28 in the regions 32 are activated by application of thermal energy 30. As mentioned above, it is highly desirable that the strained silicon carbide channel layer 20 not experience temperatures above about eight hundred centigrade. Thus, many convention anneal processes are not compatible with the design constraints of the present system, where on one hand the thermal energy must be sufficiently great as to activate the low dose drain implants, at least within the regions 32, and on the other hand the thermal energy must be sufficiently low as to not elevate the temperature of the strained silicon carbide channel layer 20 above about eight hundred centigrade.

Therefore, the thermal energy 30 is preferably provided in a first laser anneal of the integrated circuit 10. A mask 26 is utilized to prevent various portions of the integrated circuit 10 from the laser anneal. Preferably, the low dose drain dopants 28 in the regions 32 are activated with a laser fluence of between about 0.1 joules per square centimeter and about two joules per square centimeter, and most preferably about 0.65 joules per square centimeter for a 308 nanometer laser beam system. The laser fluence may vary for different laser beam wavelengths.

Because the thermal conductivity of the strained silicon carbide channel layer 20 tends to be very low, the strained silicon carbide channel layer 20 tends to not heat during the first laser anneal process, and thus is able to remain at a temperature below about eight hundred centigrade, while at the same time the thermal energy delivered by the first laser anneal to the silicon substrate 12, which has a higher thermal conductivity, is sufficient to highly activate the low dose drain dopants 28 within the regions 32. Further, the preferred polysilicon material of the gate electrode 24, which is reflective to the laser energy and thus tends to not pass the laser energy, tends to protect the strained silicon carbide channel layer 20 in the area underlying the gate electrode 24.

Figure 6:
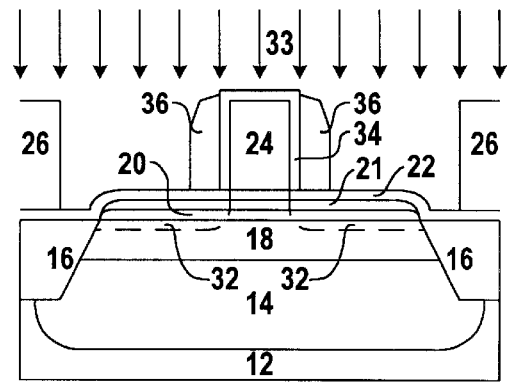
FIG. 6 is a cross sectional view of the structure of FIG. 5, depicting the insulating layer and the spacer around the gate electrode, and the source drain impregnation.

FIG. 6 depicts the integrated circuit 10 at a point in the processing at which an insulating layer 34 has been formed around the gate electrode 24. To continue the example started above, the insulating layer 34 is most preferably silicon oxide that is grown from the polysilicon of the gate electrode 24. However, even in the specific example of silicon technology, as used herein, other compatible materials and formation processes may be used to create the insulating layer 34.

As mentioned above, it is a design goal of the present invention to avoid processing the integrated circuit 10 at temperatures above eight hundred centigrade. Thus, the silicon oxide of the insulating layer 34 is preferably formed at a temperature that does not exceed about eight hundred centigrade. Most preferably, a polyreoxidation process is used to form the silicon oxide insulating layer 34 on the polysilicon gate electrode 24.

Also depicted in FIG. 6 is a spacer 36 around the gate electrode 24. In the example started above, the spacer 36 is preferably formed of polysilicon. The material selected for the spacer 36 is preferably reflective of rather than transmissive of the laser energy applied during a laser annealing process, as described more completely below. Thus, according to the present invention, neither silicon oxide nor silicon nitride are preferred selections for the material of the spacer 36, because each of these materials tends to transmit laser energy rather than to reflect laser energy. However, different laser sources may also permit the use of silicon oxide or silicon nitride, as briefly mentioned above.

Further depicted in FIG. 6 is the impregnation of a source drain dopant 33 into the substrate 12. The source drain dopant 33 may be impregnated according to one or more of a number of different processes, such as diffusion or more preferably ion implantation. In the specific example of a silicon NMOS integrated circuit 10, as introduced above, the source drain dopant 33 is preferably a species such as arsenic or antimony.

Figure 7:
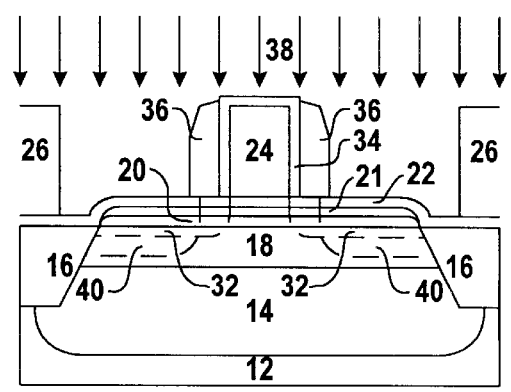
FIG. 7 is a cross sectional view of the structure of FIG. 6, depicting the second laser anneal.

The impregnated source drain dopant 33 forms source drain regions 40 in the substrate 12, as depicted in FIG. 7. The source drain dopants 33 in the regions 40 are activated by application of thermal energy 38. As mentioned above, it is highly desirable that the strained silicon carbide channel layer 20 not experience temperatures above about eight hundred centigrade. Thus, many conventional anneal processes are not compatible with the design constraints of the present system, where on one hand the thermal energy must be sufficiently great as to activate the source drain implants, and on the other hand the thermal energy must be sufficiently low as to not elevate the temperature of the strained silicon carbide channel layer 20 above about eight hundred centigrade.

Therefore, the thermal energy 38 is preferably provided in a second laser anneal of the integrated circuit 10. Prior to the second laser anneal, the source drain regions 40 are most preferably amorphized by implantation of high doses of either silicon, germanium, or argon. As described above, the amorphization tends to lower the thermal budget, that is, to lower the melting temperatures, enabling the use of a lower fluence during the second laser anneal. Preferably, the source drain dopants 33 in the regions 40 are activated with a laser fluence of between about 0.1 joules per square centimeter and about two joules per square centimeter depending on the final depth of the source drain junction, and most preferably about 0.7 joules per square centimeter. The laser may be applied as a single pulse or in a multi-pulse mode where the fluence is turned on and off with a certain frequency.

As described above, because the thermal conductivity of the strained silicon carbide channel layer 20 tends to be very low, the strained silicon carbide channel layer 20 tends to not substantially heat during the second laser anneal process, and thus is able to remain at a temperature below about eight hundred centigrade, while at the same time the thermal energy delivered by the second laser anneal to the silicon substrate 12, which has a higher thermal conductivity, is sufficient to highly activate the source drain dopants 33 within the regions 40. Further, the preferred polysilicon material of the gate electrode 24 and the spacer 36, which is reflective to the laser energy and thus tends to not pass the laser energy, tends to protect the strained silicon carbide channel layer 20 in the area underlying the gate electrode 24 and the spacer 36.

The second laser anneal is preferably performed at a higher laser fluence than the first laser anneal, so as to achieve a deeper melting of the substrate 12 in the source drain regions 40, and thereby more fully activate the dopant in the source drain regions 40. However, in alternate embodiments the fluence of the second laser anneal is less than the fluence of the first laser anneal in order to avoid melting. In further embodiments, multiple laser pulsing of the second laser anneal is performed to shape the source drain region 40 doping profile according to a desired configuration. Thus, the precision and versatility of the laser annealing process is beneficial in both retaining the strain within the strained silicon carbide channel layer 20 and in selectively activating portions of the substrate 12, as well as providing for a highly configurable doping profile.

In a further embodiment, a reflective layer may be deposited on top of gate electrode 24 before forming the insulation layer 34 to further protect the gate electrode 24 from being melted too deep. The thermal transfer from the melted gate electrode 24 towards the channel region 20 is preferably minimized to keep the channel layer 20 below eight hundred degrees centigrade. Otherwise, the channel layer 20 tends to lose its preferred conduction properties.

Although the source drain dopant and second laser anneal are described herein after the description of the formation of the insulating layer 34 and the spacer 36, it is appreciated that the source drain dopant impregnation and the second laser anneal could, in alternate embodiments, be performed prior to the formation of the insulating layer 34 and the spacer 36. Similarly, other steps of the method as described above may also be performed in an order that differs from that as given above.

Thus a integrated circuit device may be formed from the integrated circuit 10 described above, by completing the processing with contact creation and back end processing. The semiconducting device so formed is distinguishable from other semiconducting devices formed by other processes, because it has a strained silicon carbide channel layer 20 and a silicon capping layer 21, exhibiting a high degree of tensile strain throughout the strained silicon carbide channel layer 20 and at the interface of the strained silicon carbide channel layer 20 and the overlying silicon capping layer 21, and has spacers on the gate electrode, which spacers are formed of a laser-reflective material such as polysilicon, rather than of a more conventional material such as silicon oxide or silicon nitride.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. In a method for fabricating a semiconducting device on a substrate, the improvement comprising:

forming a strained silicon carbide channel layer on the substrate, forming a gate insulation layer on top of the in situ doped silicon layer at a temperature that does not exceed about eight hundred centigrade, forming a gate electrode on top of the gate insulation layer, patterning the gate electrode, impregnating a low dose drain dopant into the substrate, activating the low dose drain dopant with a first laser anneal, impregnating a source drain dopant into the substrate, and activating the source drain dopant with a second laser anneal.

2. The method of claim 1, wherein the step of forming the strained silicon carbide channel layer further comprises depositing the strained silicon carbide channel layer using a chemical vapor deposition process.

3. The method of claim 1, wherein the step of forming the strained silicon carbide channel layer further comprises growing the strained silicon carbide channel layer using a surface reaction epitaxy process.

4. The method of claim 1, wherein the step of forming the strained silicon carbide channel layer further comprises forming the strained silicon carbide channel layer having a composition of $Si_{(1-y)}C_y$, wherein y has a value as high as about two tenths.

5. The method of claim 1, wherein the step of forming the strained silicon carbide channel layer further comprises forming the strained silicon carbide channel layer with a tensile strain.

6. The method of claim 1, wherein the step of forming the strained silicon carbide channel layer further comprises forming the strained silicon carbide channel layer to a thickness of about three hundred angstroms.

7. The method of claim 1, wherein the step of forming the strained silicon carbide channel layer further comprises forming the strained silicon carbide channel layer with an in situ boron dopant.

8. The method of claim 1, wherein the step of forming the strained silicon carbide channel layer further comprises forming the strained silicon carbide channel layer with an in situ dopant at a concentration of about $10^{17}$ atoms per cubic centimeter.

9. The method of claim 1, further comprising the additional step of forming an insulating layer around the gate electrode at a temperature that does not exceed about eight hundred degrees centigrade, after the step of activating the low dose drain dopant with a first laser anneal.

10. The method of claim 1, further comprising the additional step of forming a spacer around the gate electrode of a material that is reflective to the second laser anneal, after the step of activating the low dose drain dopant with a first laser anneal.

11. The method of claim 10, wherein the spacer is formed of polysilicon.

12. The method of claim 10, wherein the spacer is formed of silicon nitride.

13. The method of claim 1, wherein the second laser anneal is performed with a higher laser fluence than the first laser anneal.

14. The method of claim 1, further comprising the additional step of an amorphization implant of at least one of silicon, germanium, and argon prior to the step of impregnating the low dose drain dopant into the substrate.

15. The method of claim 1, further comprising the additional step of an amorphization implant of at least one of silicon, germanium, and argon prior to the step of activating the source drain dopant with a second laser anneal.

16. The method of claim 1, further comprising the additional step of forming a reflective layer on top of the gate electrode prior to the step of activating the source drain dopant with the second laser anneal, where the reflective layer is reflective to the second laser anneal.

17. A integrated circuit device formed according to the method of claim 1.

18. In a method for fabricating a semiconducting device on a substrate, the improvement comprising:

forming a strained silicon carbide channel layer on the substrate, the strained. silicon carbide channel layer formed with an in situ boron dopant at a concentration of about $10^{17}$ atoms per cubic centimeter, forming a silicon layer on top of the strained silicon carbide channel layer, forming a gate oxide layer on top of the silicon layer at a temperature that does not exceed about eight hundred centigrade, forming a polysilicon gate electrode on top of the gate oxide layer, patterning the polysilicon gate electrode, ion implanting a low dose drain dopant into the substrate, activating the low dose drain dopant with a first laser anneal, forming an oxide layer around the polysilicon gate electrode at a temperature that does not exceed about eight hundred centigrade, forming a polysilicon spacer around the gate electrode, ion implanting a source drain dopant into the substrate, and activating the source drain dopant with a second laser anneal.

19. A integrated circuit device formed according to the method of claim 18.

20. In a semiconducting device having a gate electrode, the improvement comprising a strained silicon carbide channel layer and a spacer around the gate electrode, the spacer formed of a material that is reflective to a laser anneal.

* * * * *